(12) United States Patent
Bae et al.

(10) Patent No.: US 7,211,944 B2
(45) Date of Patent: May 1, 2007

(54) DUAL PANEL-TYPE ORGANIC ELECTROLUMINESCENT DISPLAY DEVICE AND METHOD OF FABRICATING THE SAME

(75) Inventors: Sung-Joon Bae, Geyonggi-do (KR); Jae-Yong Park, Geyonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 587 days.

(21) Appl. No.: 10/734,607

(22) Filed: Dec. 15, 2003

(65) Prior Publication Data

US 2005/0127825 A1 Jun. 16, 2005

(30) Foreign Application Priority Data

Dec. 13, 2002 (KR) ............... 10-2002-0079510

(51) Int. Cl.
*H05B 33/08* (2006.01)
*H05B 33/06* (2006.01)
*H05B 33/10* (2006.01)
*H01L 51/50* (2006.01)
*H01L 51/56* (2006.01)

(52) U.S. Cl. ............... 313/503; 313/506; 313/500; 313/505; 257/40; 257/59; 257/72

(58) Field of Classification Search ............... 313/500, 313/503, 505, 506; 257/40, 59, 72
See application file for complete search history.

(56) References Cited

U.S. PATENT DOCUMENTS 6,548,961 B2 * 4/2003 Barth et al. ............... 313/506

2002/0079494 A1 6/2002 Kim et al.

(Continued)

FOREIGN PATENT DOCUMENTS

EP 1605516 A2 * 12/2005

(Continued)

*Primary Examiner*—Mariceli Santiago
(74) *Attorney, Agent, or Firm*—Morgan, Lewis & Bockius, LLP

(57) ABSTRACT

An organic electroluminescent display (ELD) device includes first and second substrates having a plurality of sub-pixels defined thereon, an array element layer on the first substrate having a plurality of thin film transistors corresponding to each of the sub-pixels, a connecting electrode on the array element layer connected to one of the thin film transistors, a first electrode on an inner surface of the second substrate, an insulating layer and an electrode separator formed within a boundary region of each of the sub-pixels, the insulating layer formed beneath the first electrode and the electrode separator formed beneath the insulating layer, and an organic light-emitting layer and a second electrode formed in each of the sub-pixels, wherein the electrode separator includes a first region having a pattern structure for separately forming the organic light-emitting layer and the second electrode within each of the sub-pixels, a second region having a pattern structure for directly contacting the connecting electrode with the second electrode under the electrode separator, and a third region having a pattern structure for preventing an electrical short between a second electrode portion in the first region and a second electrode portion in the second region, and wherein the second electrode formed within a space corresponding to the second region contacts the connecting electrode.

30 Claims, 13 Drawing Sheets

U.S. PATENT DOCUMENTS

| | | |
|---|---|---|
| 2002/0079833 A1 | 6/2002 | Kobayashi et al. |
| 2002/0158577 A1* | 10/2002 | Shimoda et al. ............ 313/506 |
| 2003/0160564 A1 | 8/2003 | Park et al. |
| 2003/0201445 A1 | 10/2003 | Park et al. |
| 2004/0100191 A1* | 5/2004 | Park .......................... 313/506 |

FOREIGN PATENT DOCUMENTS

| | | |
|---|---|---|
| JP | 2001-085167 | 3/2001 |
| JP | 2004342432 A * | 12/2004 |
| WO | WO 02/078101 | 10/2002 |

\* cited by examiner

DUAL PANEL-TYPE ORGANIC ELECTROLUMINESCENT DISPLAY DEVICE AND METHOD OF FABRICATING THE SAME

The present invention claims the benefit of Korean Patent Application No. 2002-79510, filed in Korea on Dec. 13, 2002, which is hereby incorporated by reference.

BACKGROUND OF THE INVENTION

1. Field of the Invention

The present invention relates to a flat panel display device, and more particularly, to an organic electroluminescent display (OELD) device and method of fabricating an OELD device.

2. Discussion of the Related Art

Liquid crystal display (LCD) devices have been commonly used in flat panel display devices because of their light weight and low power consumption. However, the liquid crystal display (LCD) devices are not light emitting elements, but are light receiving elements that require additional light sources to display images. Accordingly, there is a technical limit for improving brightness, contrast ratio, viewing angle, and enlarging a size of liquid crystal display panels. Thus, research has developed new flat panel display elements that can overcome the aforementioned problems.

Organic electroluminescent display (OELD) devices emit their own light and their viewing angles and contrast ratios are superior compared to the liquid crystal display (LCD) devices. In addition, since OELD device do not require a backlight device to function as a light source, the OELD devices are light weight, have small dimensions, and have low power consumption. Moreover, OELD devices can be driven with low DC (direct current) and have fast response times. Since the OELD devices use solid material instead of fluid material, such as liquid crystal, they are more stable under external impact and have wider operational temperature ranges than the liquid crystal display (LCD) devices. As compared to LCD devices, the OELD devices have relatively low production costs. For example, the OELD devices generally require deposition and encapsulation apparatus, whereas the LCD devices require many different types of fabrication apparatus. In addition, fabrication processes for manufacturing the OELD device are much simpler than the fabrication process for manufacturing the LCD devices.

The OELD devices may be classified into passive matrix-type and active matrix-type devices. In the passive matrix-type OELD devices, pixels are formed in a matrix configuration by crossings of scan and signal lines, wherein the scan lines must be sequentially driven to drive each pixel. Accordingly, a required average luminance depends on a total number of the scan lines. However, in the active matrix-type OELD devices, a thin film transistor (i.e., a switching element) is formed in each sub-pixel to switch the pixel ON and OFF, wherein a first electrode connected to the thin film transistor is turned ON and OFF by the pixel and a second electrode functions as a common electrode.

Moreover, in the active matrix-type OELD devices, a voltage that is supplied to the pixel is stored to a storage capacitor $C_{St}$ and maintained until a signal for the next frame is applied. Accordingly, the pixel can retain the signal until the next frame regardless of the number of the scan lines. Since the active matrix-type OELD devices can obtain a same luminance with low direct current (DC), the active matrix-type OELD devices are advantageous due to their low power consumption, high resolution, and large size.

FIG. 1 is a schematic circuit diagram of a pixel of an active matrix OELD device according to the related art. In FIG. 1, a scan line 2 is formed along a first direction and signal and power supply lines 4 and 6 are formed along a second direction perpendicular to the first direction. The signal line 4 and the power supply line 6 are spaced apart from each other and define a sub-pixel by crossing the scan line 2, wherein a switching thin film transistor 8 (i.e., an addressing element) is formed at a position near an intersection of the scan and signal lines 2 and 4 and a storage capacitor ($C_{ST}$) 12 is electrically connected to the switching thin film transistor 8 and the power supply line 6. A driving thin film transistor 10 (i.e., a current source element) is electrically connected to the storage capacitor ($C_{ST}$) 12 and the power supply line 6, and an organic electroluminescent diode 14 is electrically connected to the driving thin film transistor 10. Accordingly, if current is supplied to organic light-emitting material of the OELD device along a positive direction, electrons and holes are recombined by passing through a P-N junction between an anode electrode for proving holes and a cathode electrode for proving electrons. The combined electron and the hole have a lower energy state than when the electron and the hole are not recombined and separated away. Accordingly, the OELD device makes use of energy states of the recombined electrons and holes to produce light. In addition, the OELD device can be classified into top emission-type and bottom emission-type OELD devices according to a light emission direction.

FIG. 2 is a cross sectional view of a bottom emission-type OELD device according to the related art. In FIG. 2, a pixel P includes sub-pixels SP for red (R), green (G), and blue (B) colors, wherein first and second substrates 10 and 30 are spaced apart from and oppose each other. A seal pattern 40 is formed on one of the first and second substrates 10 and 30 to attach the first and second substrates 10 and 30 and to prevent liquid crystal material injected between the first and second substrates 10 and 30 from leaking out. A plurality of thin film transistors T and a plurality of first electrodes 12 connected to the thin film transistor is formed within each sub-pixel SP on a transparent substrate 1 of the first substrate 10. An organic light-emitting layer 14 connected to the thin film transistor T is formed on the thin film transistor T and the first electrode 12, wherein the organic light-emitting layer 14 has portions for red (R), green (G), and blue (B) colors corresponding to the first electrode 12. In addition, a second electrode 16 is formed on the organic light-emitting layer 14, wherein the first and second electrodes 12 and 16 serve to supply an electric field to the organic light-emitting layer 14 and the second electrode 16 is spaced apart from the second substrate 30 by the aforementioned seal pattern 40. Although not shown, a moisture absorbent desiccant is formed on an inner side of the second substrate 30 and a semitransparent tape is used to attach the moisture absorbent desiccant to the second substrate 30.

If the first electrode 12 functions as an anode electrode and the second electrode 16 functions as a cathode electrode, then the first electrode 12 is formed of transparent conductive material and the second electrode 16 is formed of material having a low work function. Accordingly, the organic light-emitting layer 14 has a sequential laminated structure of a hole injection layer 14a, a hole transporting layer 14b, an emission layer 14c, and an electron transporting layer 14d. The emission layer 14c has a structure in which light emitting materials for each of the red (R), green (G), and blue (B) colors are sequentially arranged corresponding to each of the sub-pixels SP.

FIG. 3 is an enlarged view of a sub-pixel region SP of FIG. 2 according to the related art. In FIG. 3, the sub-pixel region SP (in FIG. 2) includes a light emission region, a TFT region, and a storage capacitor region. In the TFT region, a semiconductor layer 62, a gate electrode 68, and source and drain electrodes 80 and 82 are sequentially formed on a transparent substrate 1, thereby forming a thin film transistor T (in FIG. 2). A power electrode 72 extending from a power supply line (not shown) and an organic electroluminescent diode E are connected to the source electrode 80 and the drain electrode 82, respectively. In the storage capactor region, a capacitor electrode 64 is formed under the power electrode 72 using the same material as that of the semiconductor layer 62, and an insulating layer is disposed between the power electrode 72 and the capacitor electrode 64, wherein the capacitor electrode 64, the insulating layer, and the power electrode 72 form a storage capacitor. In the light emission region, the organic electroluminescent diode E has first and second electrodes 12 and 16, and an organic light-emitting layer 14 interposed between the first and second electrodes 12 and 16.

FIG. 4 is a flow chart of a fabrication sequence of an OELD device according to the related art. In FIG. 4, a first step ST1 includes forming array elements, such as scan lines, signal lines, power lines, switching thin film transistors and driving thin film transistors, on a first substrate. The scan lines are formed on a transparent substrate extending along a first direction and the signal and power lines are formed on the transparent substrate extending along a second direction perpendicular to the first direction, wherein the signal and power lines cross the scan lines and are spaced apart from each other. In addition, each of the switching thin film transistors are formed near intersections of the scan and signal lines, and each of the driving thin film transistors are formed near intersections of the scan and power lines.

A second step (ST2) includes patterning a first electrode, which is a first component of an organic electroluminescent diode and is connected to the driving thin film transistor, within each sub-pixel region.

A third step (ST3) includes forming an organic light-emitting layer, which is a second component of the organic electroluminescent diode, on the first electrode. If the first electrode functions as an anode electrode, the organic light-emitting layer may be formed in a sequence of a hole injection layer, a hole transporting layer, an emission layer, and an electron transporting layer from a top surface of the first electrode.

A fourth step (ST4) includes forming a second electrode, which is a third component of the organic electroluminescent diode, on the light-emitting layer, wherein the second electrode is formed on an entire surface of the first substrate to function as a common electrode.

A fifth step (ST5) includes encapsulating the first substrate with a second substrate to protect the first substrate from external impact and to protect the organic light-emitting layer from being damaged by an infiltration of exterior air. Thus, an absorbent desiccant is further formed in an inner surface of the second substrate.

The bottom emission-type OELD devices are completed by attaching the encapsulated substrate upon which the array element layer and the organic electroluminescent diode are formed to an additional encapsulating substrate. If the array element layer and the organic electroluminescent diode are formed on the same substrate, then panel yield is dependent upon the product of the individual yields of the array element layer and the organic electroluminescent diode. However, the panel yield is greatly affected by the yield of the organic electroluminescent diode. Accordingly, if a defective organic electroluminescent diode is fabricated, which usually is caused by formation of thin films having thicknesses of 1000 Å contaminated by impurities, the panel is classified as an inferior panel. Thus, production costs and materials are lost, thereby decreasing the panel yield.

The bottom emission-type organic OELD devices are advantageous because of their high image stability and variable fabrication processing. However, the bottom emission-type OELD devices are not adequate for implementation in devices that require high resolution due to limitations of increased aperture ratios. In addition, since top emission-type OELD devices emit light upward through the substrate, the light can be emitted without undue influence by the thin film transistor that is positioned under the light-emitting layer. Accordingly, design of the thin film transistor may be simplified. In addition, the aperture ratio can be increased, thereby increasing an operational life span of the OELD device. However, since a cathode is commonly formed over the organic light-emitting layer in the top emission-type OELD devices, material selection and light transmittance are limited such that light transmission efficiency is lowered. If a thin film-type passivation layer is formed to prevent a reduction of the light transmittance, the thin film passivation layer may fail to prevent infiltration of exterior air into the device.

SUMMARY OF THE INVENTION

Accordingly, the present invention is directed to an organic electroluminescent display (OELD) device and method of fabricating an organic electroluminescent display (OELD) device that substantially obviates one or more of problems due to limitations and disadvantages of the related art.

An object of the present invention is to provide an OELD device having an improved electrode structure.

Another object of the present invention is to provide an OELD device having improved contact electrodes.

An object of the present invention is to provide a method of fabricating an OELD device having an improved electrode structure.

Another object of the present invention is to provide a method of fabricating an OELD device having improved contact electrodes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display (ELD) device includes first and second substrates having a plurality of sub-pixels defined thereon, an array element layer on the first substrate having a plurality of thin film transistors corresponding to each of the sub-pixels, a connecting electrode on the array element layer connected to one of the thin film transistors, a first electrode on an inner surface of the second substrate, an insulating layer and an electrode separator formed within a boundary region of each of the sub-pixels, the insulating layer formed beneath the first electrode and the electrode separator formed beneath the insulating layer, and an organic light-emitting layer and a second electrode formed in each of the sub-pixels, wherein the electrode separator includes a first region having a pattern structure for separately forming the organic light-emitting layer and the second electrode within each of the sub-pixels, a second region having a pattern structure for directly contacting the connecting electrode with the second electrode under the electrode separator, and a third region having a pattern structure for preventing an electrical short between a second electrode portion in the first region and a second electrode portion in the second region, and wherein the second electrode formed within a space corresponding to the second region contacts the connecting electrode.

In another aspect, a method of fabricating an organic electroluminescent display (ELD) device having a first substrate including an array element layer comprising a thin film transistor, a second substrate having an organic electroluminescent diode, and a connecting electrode between the first and second substrates, the method includes forming a first electrode on the second substrate having a plurality of sub-pixels, forming an insulating layer and an electrode separator within a boundary of each of the sub-pixels, and forming an organic light-emitting layer and a second electrode within each of the sub-pixels separated by the electrode separator, wherein the electrode separator includes a first region having a trapezoidal shape with a width gradually increasing from a bottom surface and to a top surface, a second region having an asymmetrical shape with a first inverse-tapered lateral side and a second lateral side inclined toward the first lateral side, and a third region having a plurality of depressed portions spaced apart from each other and disposed between the first and second regions, and wherein the second electrode is formed within a space corresponding to the second region and contacts the connecting electrode.

In another aspect, a method for fabricating an organic electroluminescent display (ELD) device includes forming an array element layer having a plurality of thin film transistors on a first substrate upon which a first plurality of sub-pixels is defined, forming a connecting electrode connected to the thin film transistor on the array element layer, forming a first electrode on a second substrate upon which a second plurality of sub-pixels is defined that correspond to the first plurality of sub-pixels, forming an insulating layer and an electrode separator within a boundary of each of the first and second plurality of sub-pixels, forming an organic light-emitting layer and a second electrode within each of the first and second plurality of sub-pixels separated by the electrode separator, and attaching the first and second substrates together, wherein the electrode separator has a first region having a trapezoidal shape with a width gradually increasing from a bottom surface and to a top surface, a second region having an asymmetrical shape with a first inverse-tapered lateral side and a second lateral side inclined toward the first lateral side, and a third region having a plurality of depressed portions spaced apart from each other and disposed between the first and second regions, and wherein the second electrode is formed within a space corresponding to the second region and contacts the connecting electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, which are illustrated in the accompanying drawings.

Figure 1:
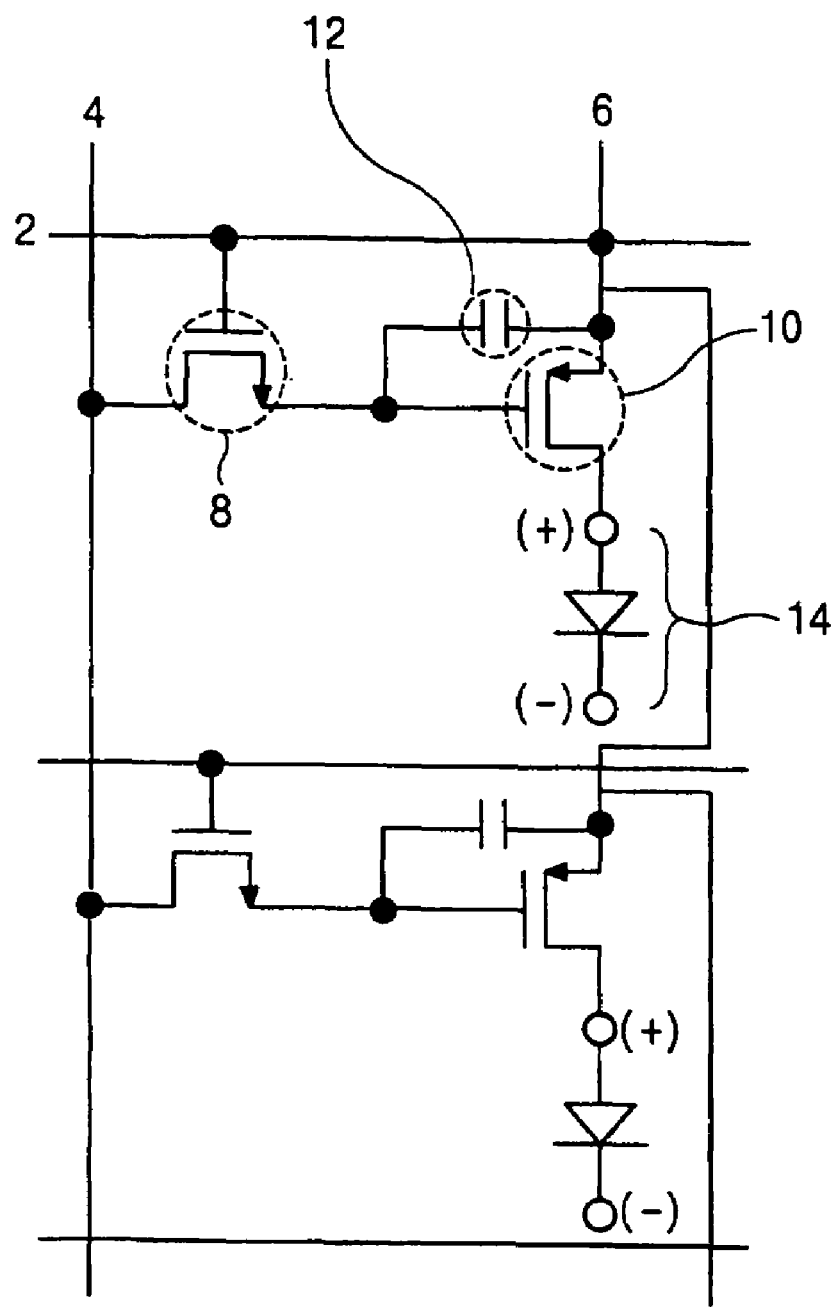
FIG. 1 is a schematic circuit diagram of a pixel of an active matrix OELD device according to the related art.
Figure 2:
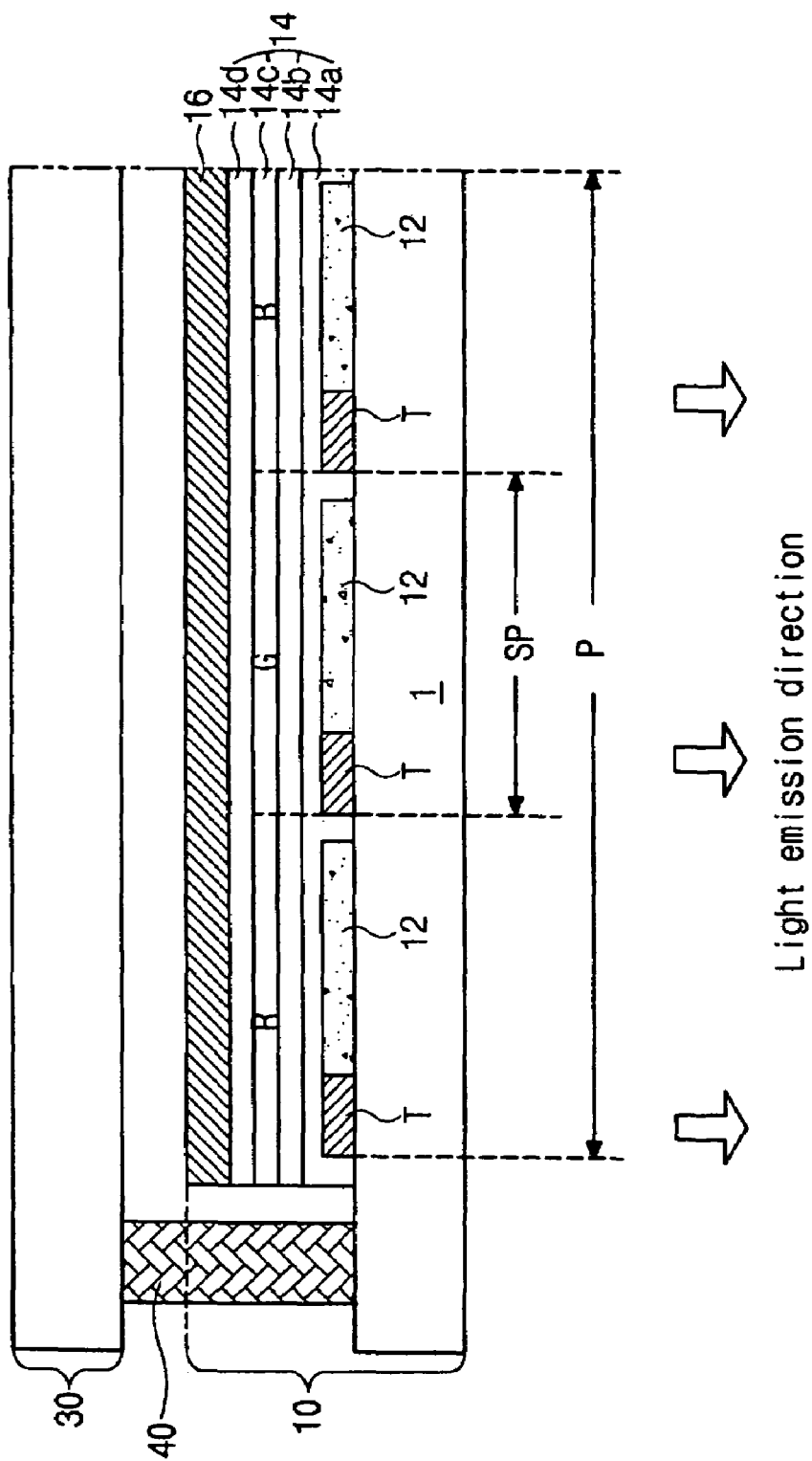
FIG. 2 is a cross sectional view of a bottom emission-type OELD device according to the related art.
Figure 3:
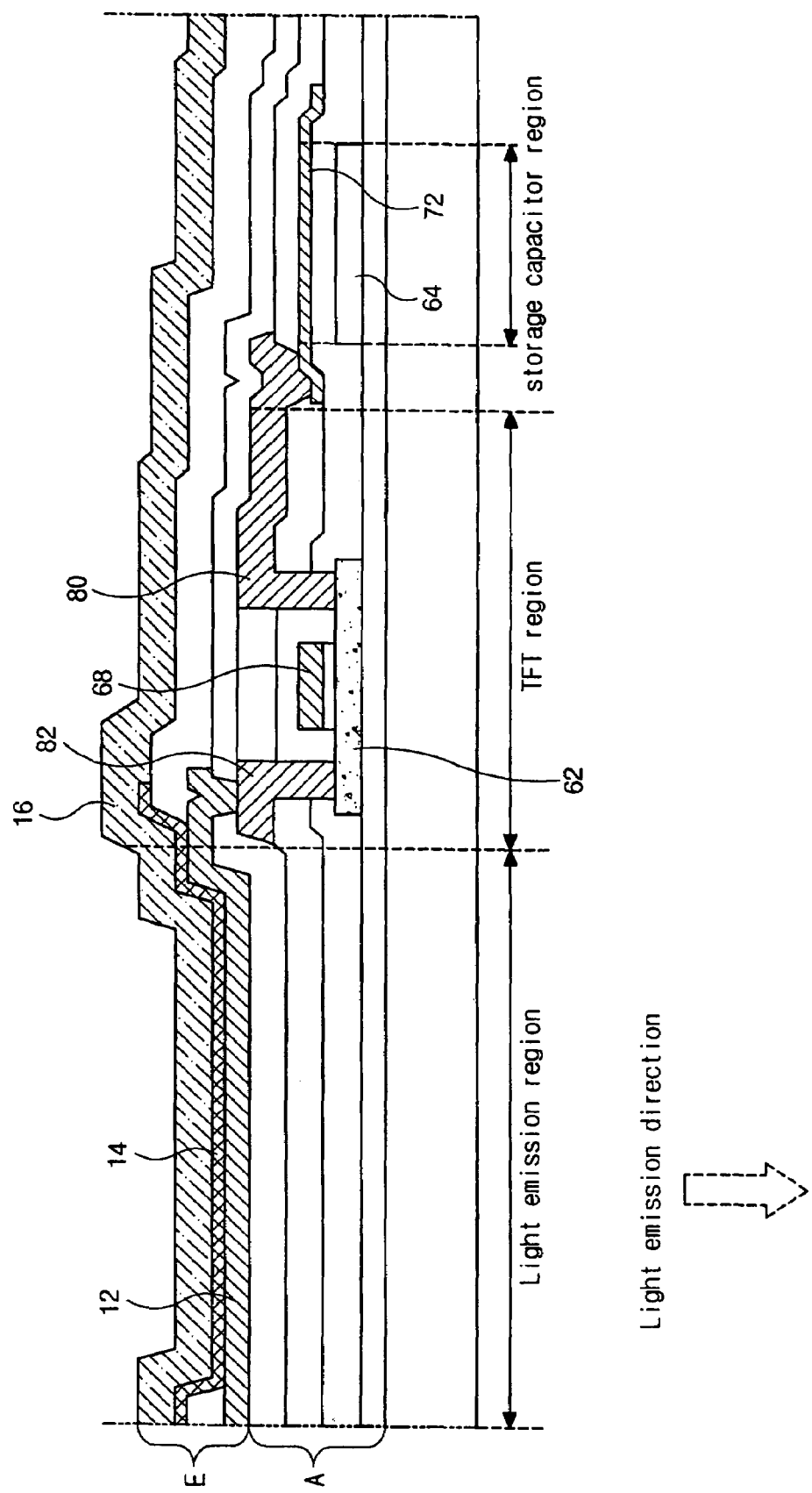
FIG. 3 is an enlarged view of a sub-pixel SP region of FIG. 2 according to the related art.
Figure 4:
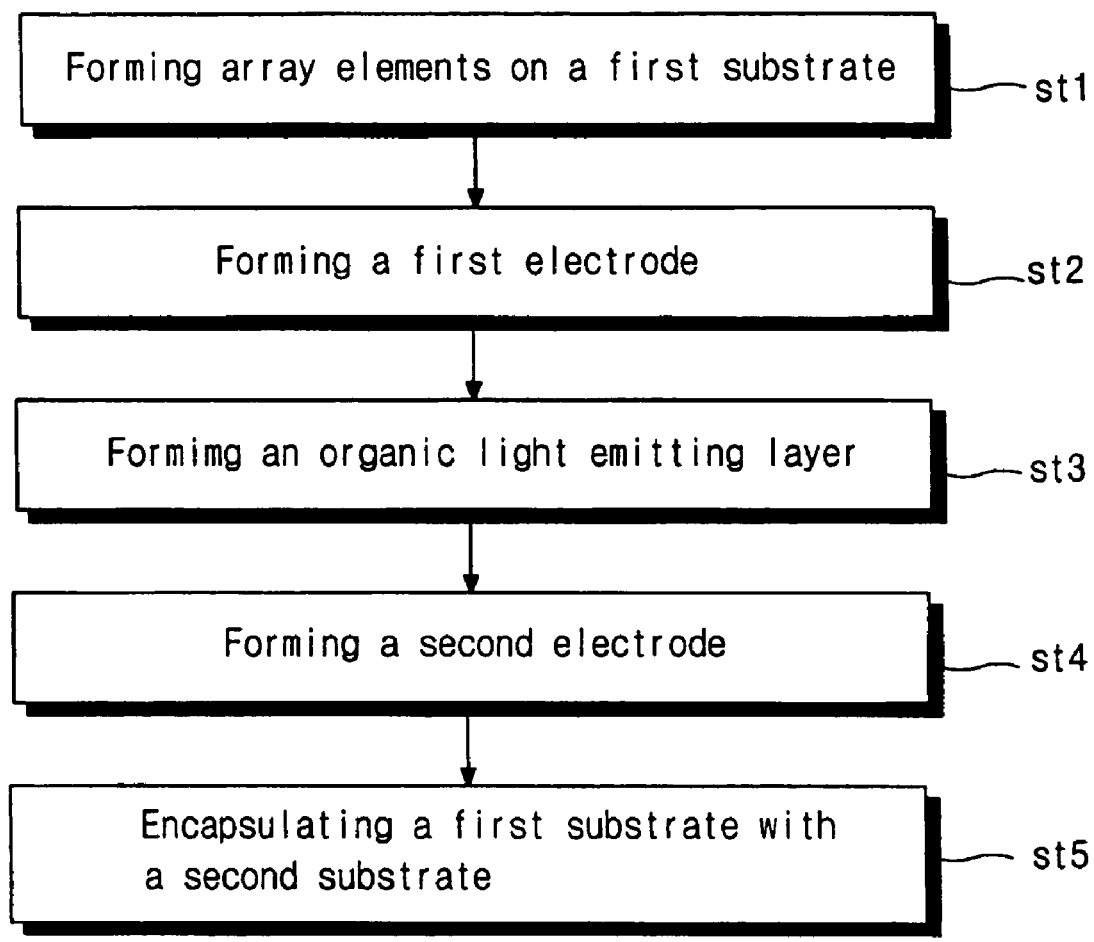
FIG. 4 is a flow chart of a fabrication sequence of an OELD device according to the related art.
Figure 5:
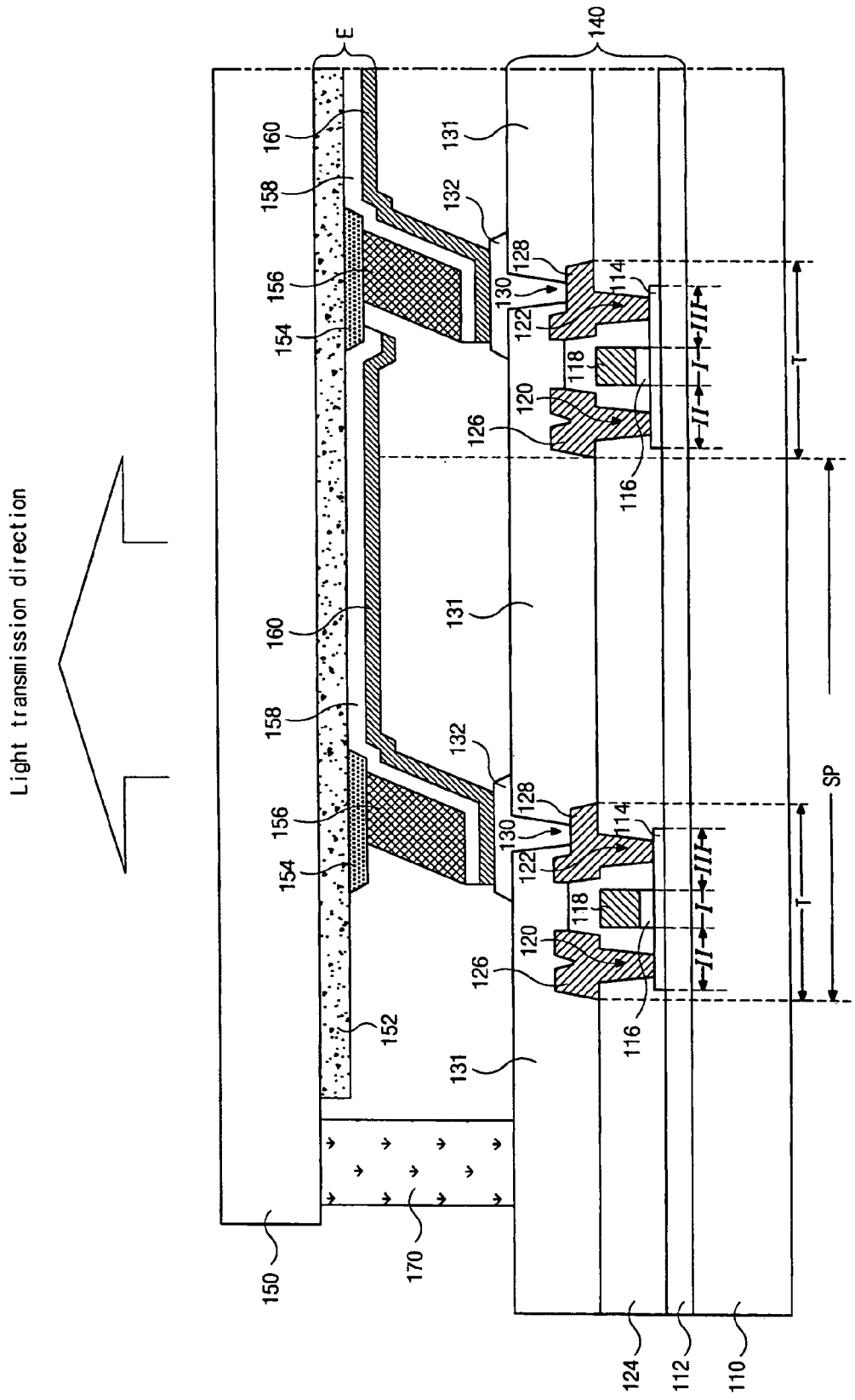
FIG. 5 is a cross sectional view of an exemplary dual panel-type OELD device according to the present invention.

FIG. 5 is a cross sectional view of an exemplary dual panel-type OELD device according to the present invention. For sake of brevity, a portion of the dual panel-type OELD device near a driving thin film transistor is shown, and a storage capacitor and a switching thin film transistor are excluded from being shown. In FIG. 5, first and second substrates 110 and 150 may be spaced apart from and oppose each other, wherein a plurality of sub-pixels SP may be defined on the first and second substrates 110 and 150. An array element layer 140 having a plurality of thin film transistors TFT corresponding to each the sub-pixels SP may be formed on the first substrate 110, and a connecting electrode 132 connected to the thin film transistor T may be formed on the array element layer 140. A first electrode 152 may be formed on an inner surface of the second substrate 150, and an insulating layer 154 and an electrode separator 156 may be formed near a boundary of each of the sub-pixels SP. An organic light-emitting layer 158 and a second electrode 160 may be formed within each of the sub-pixels SP in space between the electrode separators 156 without using an additional patterning process. The first and second electrodes 152 and 160 and the light-emitting layer 158 form an organic electroluminescent diode E.

Although not shown, the electrode separator 156 may have a frame structure formed along boundaries of the sub-pixels SP, and may include first, second, and third regions. The first region may separate the second electrode within one of the sub-pixels SP from the second electrode in an adjacent one of the sub-pixels SP. The second region may include a region where the connecting electrode 132 is connected to the second electrode 160. The third region disposed between the first and second regions may prevent an electrical short of the second electrodes in the adjacent ones of the sub-pixels SP. The electrode separator 156 may correspond to the second region, and the connecting electrode 132 may be electrically connected to a bottom surface of the second electrode 160 formed within each of the sub-pixels SP.

The first and second substrates 110 and 150 may be attached together by a seal pattern 170 formed on one of the first and second substrates 110 and 150. An inert gas or a liquid may be injected into a space between the attached first and second substrates 110 and 150 to prevent exposure of a laminated structure of the OELD device to moisture and ambient air. A buffer layer 112 may be formed along an entire surface of the first substrate 110, and a semiconductor layer 114 having an active region I, a source region II, and a drain region III within each of the sub-pixels SP may be formed on the buffer layer 112. The source and drain regions II and III may be disposed on both sides of the active region I, and a gate insulating layer 116 and the gate electrode 118 may be sequentially formed on the active region I.

A first passivation layer 124 having a first and second contact holes 120 and 122 for exposing portions of the source and drain regions II and III, respectively, may be formed on an entire surface of the first substrate 110 upon which the gate insulating layer 116 and the gate electrode 118 may be formed. Source and drain electrodes 126 and 128 may be formed on the first passivation layer 124, and may be electrically connected to the source and drain regions II and III via the first and second contact holes 120 and 122, respectively. In addition, a second passivation layer 131 having a third contact hole 130 for exposing a portion of the drain electrode 128 may be formed on an entire surface of the first substrate 110 upon which the source and drain electrodes 126 and 128 may be formed. A connecting electrode 132 may be formed on the second passivation layer 132, and may be electrically connected to the drain electrode 128 via the third contact hole 130. The connecting electrode 132 may contact a bottom surface of the second electrode 160 that is formed under the electrode separator 156, whereby current may flow from the drain electrode 128 to the second electrode 160. The semiconductor layer 114, the gate electrode 118, and the source and drain electrodes 126 and 128 form a driving thin film transistor T. Although not shown, a storage capacitor connected to the driving thin film transistor T and a switching thin film transistor connected to the gate electrode 118 of the driving thin film transistor T may be further formed in each of the sub-pixels SP.

Figure 6:
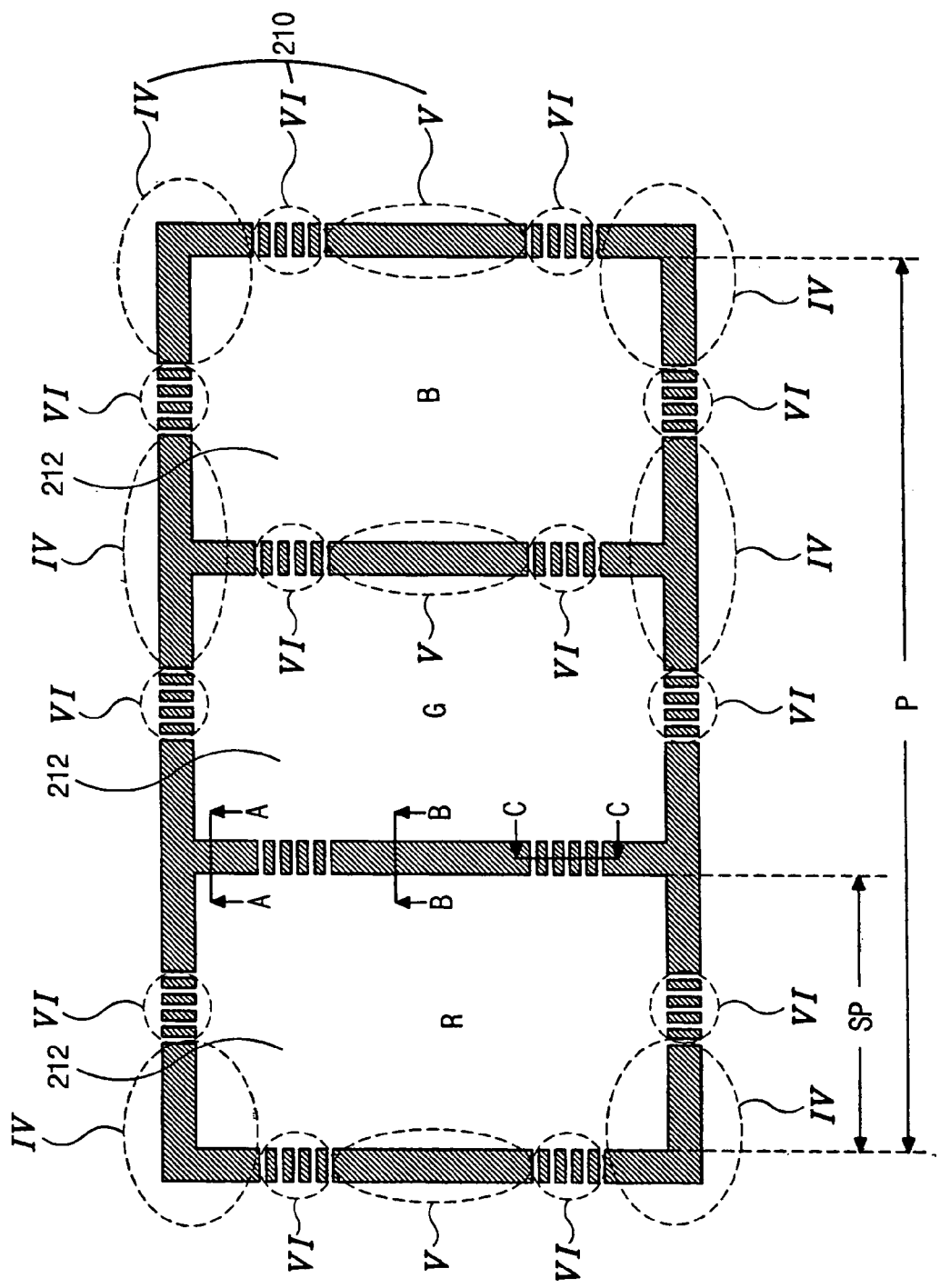
FIG. 6 is a plan view of an exemplary dual panel-type OELD device according to the present invention.

FIG. 6 is a plan view of an exemplary dual panel-type OELD device according to the present invention. In FIG. 6, an electrode separator 210 may be formed along boundaries of the sub-pixels SP for red (R), green (G), and blue (B) colors, and a second electrode 212 may be separately formed within each of the sub-pixels SP by the electrode separator 210. The electrode separator 210 may include a first region IV, a second region V, and a third region VI. The first region IV may function to separate the second electrode 212 for each of the sub-pixels SP. The second region V may function to directly connect the connecting electrode (not shown) to the second electrode 212 under the electrode separator 210. The third region VI may be disposed between the first and second regions IV and V, and may function to prevent electrical shorting of the second electrodes 212 between the first region IV and the second region V. The electrode separator 210 having the first, second, and third regions IV, V, and VI may be formed in a body, as shown in FIG. 6, but each region of the first, second, and third regions IV, V, and VI may have a different pattern structure.

Figure 7A:
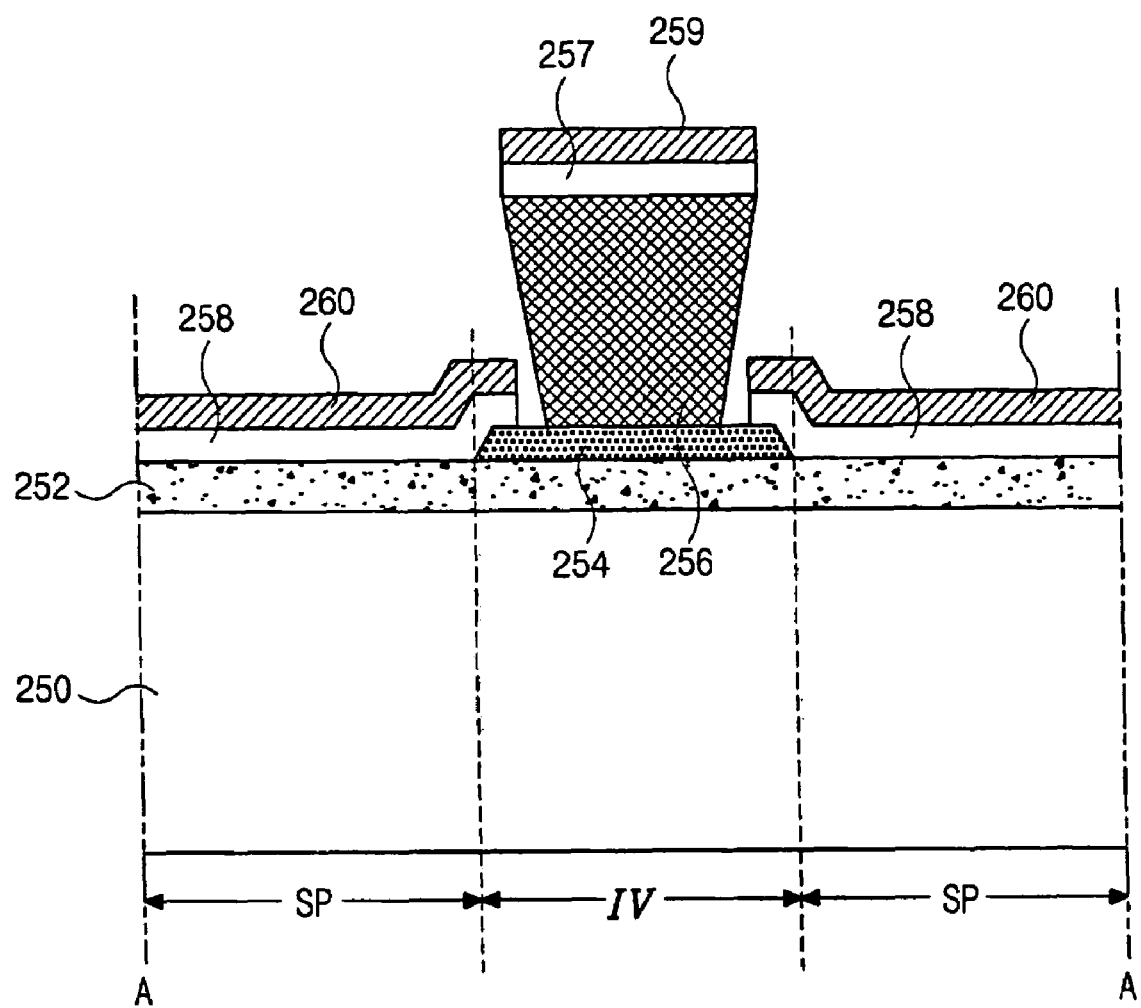
FIG. 7A is a cross sectional view along I—I of FIG. 6 according to the present invention.
Figure 7B:
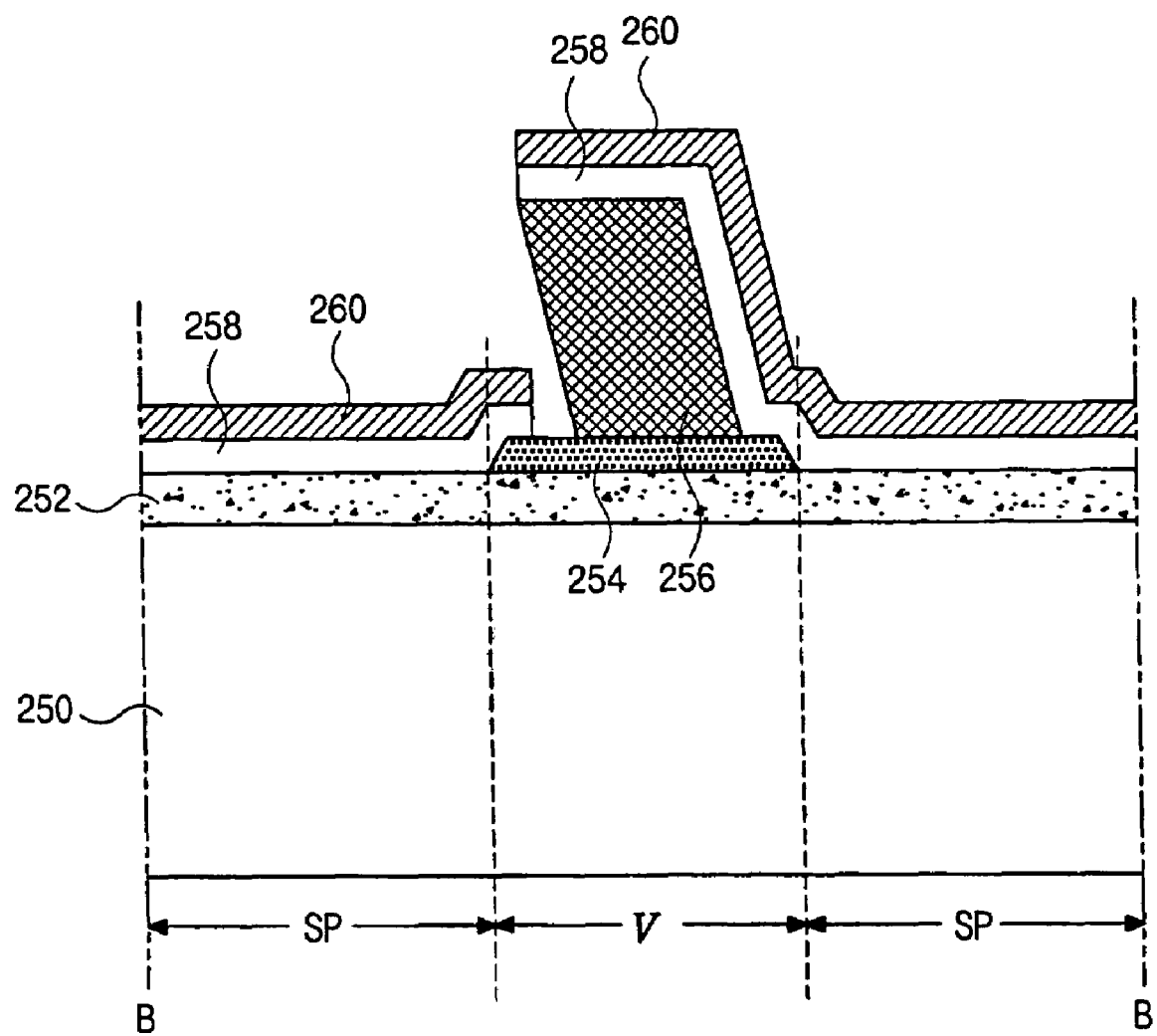
FIG. 7B is a cross sectional view along II—II of FIG. 6 according to the present invention.
Figure 7C:
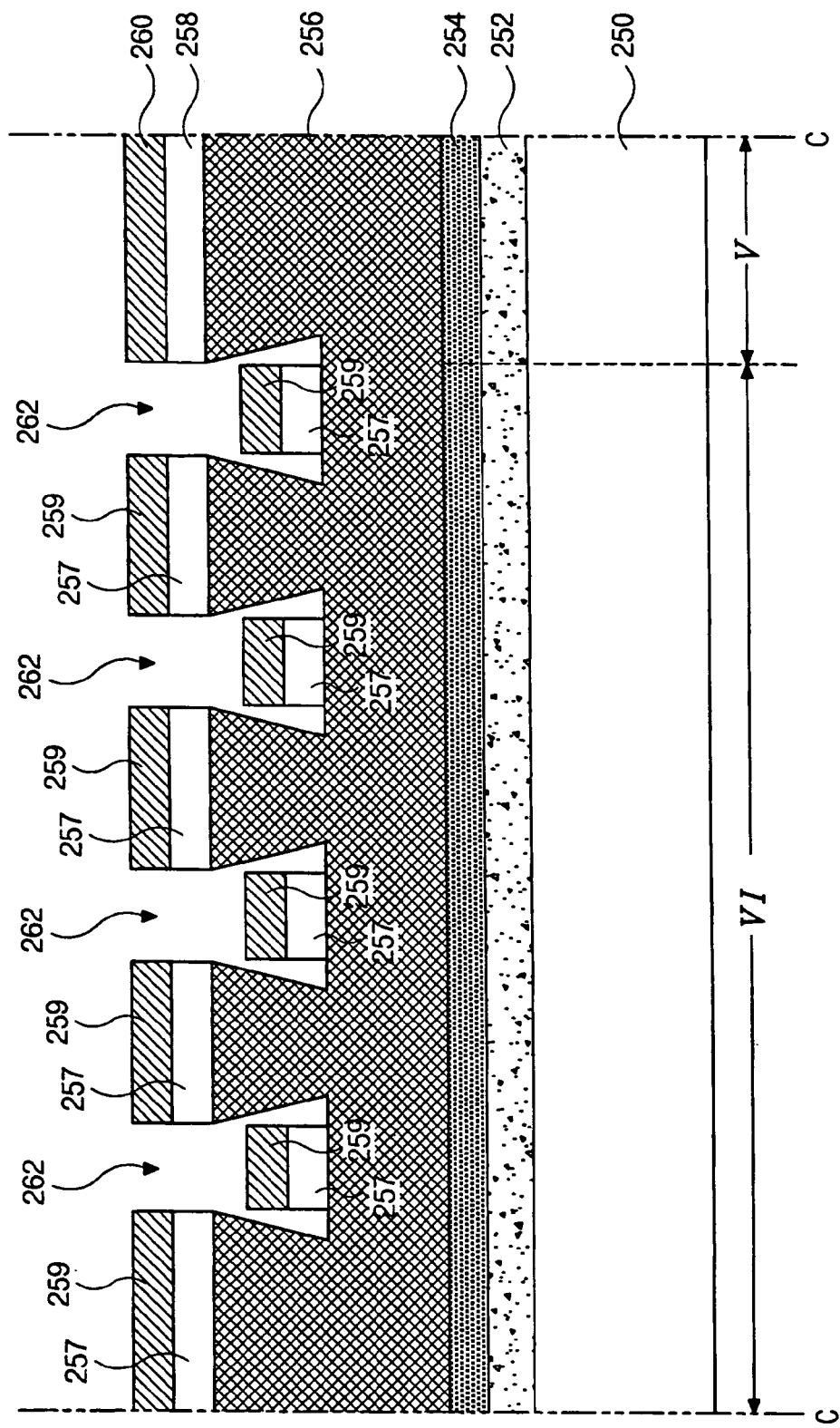
FIG. 7C is a cross sectional view along III—III of FIG. 6 according to the present invention.

FIG. 7A is a cross sectional view along I—I of FIG. 6 according to the present invention, FIG. 7B is a cross sectional view along II—II of FIG. 6 according to the present invention, and FIG. 7C is a cross sectional view along III—III of FIG. 6 according to the present invention. FIGS. 7A, 7B, and 7C correspond to the first, second, and third regions IV, V and VI in FIG. 6. In FIG. 7A, a first electrode 252 may be formed on a substrate 250 upon which a plurality of sub-pixels SP may be defined. An insulating layer 254 and an electrode separator 256 may be sequentially formed on the first electrode 252 within space corresponding to a boundary region of adjacent ones of the sub-pixels SP. An organic light-emitting layer 258 and a second electrode 260 may be separately formed within each of the sub-pixels SP by the electrode separator 256.

In FIG. 7A, a pattern structure of the electrode separator 256 corresponding to the first region IV and the electrode separator corresponding to the first region IV may have a trapezoidal pattern whose width increases from a bottom surface to a top surface of the electrode separator 256. The organic light-emitting layer 258 and the second electrode 260 may be sequentially formed within the sub-pixels SP at both sides of the electrode separator 256, and may be separated by the electrode separator 256. Accordingly, if organic light-emitting material 257 and second electrode material 259 are sequentially formed on the substrate 250 upon which the electrode separator 256 may be formed, the electrode separator 256 may function as a mask to prevent residues of the organic light-emitting material 257 and the second electrode material 259 from contacting the organic light-emitting layer 258 and the second electrode 260. Thus, organic light-emitting material 257 and second electrode material 259 may remain on a top surface of the electrode separator 256.

In FIG. 7B, the electrode separator 256 may have an asymmetrical structure with respect to a centerline of the insulating layer 254 under the electrode separator 256. The second electrode 260 may directly contact the connecting electrode (not shown) within an electrode separator-forming region. Accordingly, since a first side of the electrode separator 256 may have a tapered shape, which may be similar to the electrode separator 256 (in FIG. 7A), and a second side of the electrode separator 256 may have a tapered shape as an opposing sides of the electrode separator 256, the organic light-emitting layer 258 and the second electrode 260 on the left side of the electrode separator 256 are electrically separated from the organic light-emitting layer 258 and the second electrode 260 in an adjacent one of the sub-pixels SP on the right side of the electrode separator 256. In addition, the organic light-emitting layer 258 and the second electrode 260 are formed along a tapered lateral side and along the top surface of the electrode separator 256, Furthermore, the electrode separator 256 may be formed within a non-light emission region and the second electrode 260 may be formed on the top surface of the electrode separator 256 and may directly contact the connecting electrode (not shown). Thus, the connecting electrode (not shown) may be electrically connected to the second electrode 260 without forming an additional connecting pattern between the connecting electrode (not shown) and the second electrode 260 due to the electrode separator 256 being formed within the non-light emission region.

In FIG. 7C, the electrode separator 256 may include a plurality of depressed portions 262 spaced apart from each other. Accordingly, the organic light-emitting material 257 and the second electrode material 259 may be sequentially formed on the electrode separator 256 and on bottom portions of the depressed portions 262 within the third region VI. The organic light-emitting material 257 and the second electrode material 259 formed on the electrode separator 256 within the second region V may function as the organic light-emitting layer 258 and the second electrode 260, respectively. In addition, the depressed portion 262 may be formed to have a depth so as not to expose the insulating layer 254, and may be patterned using photolithographic processes, such as diffraction exposure processes.

Figure 8:
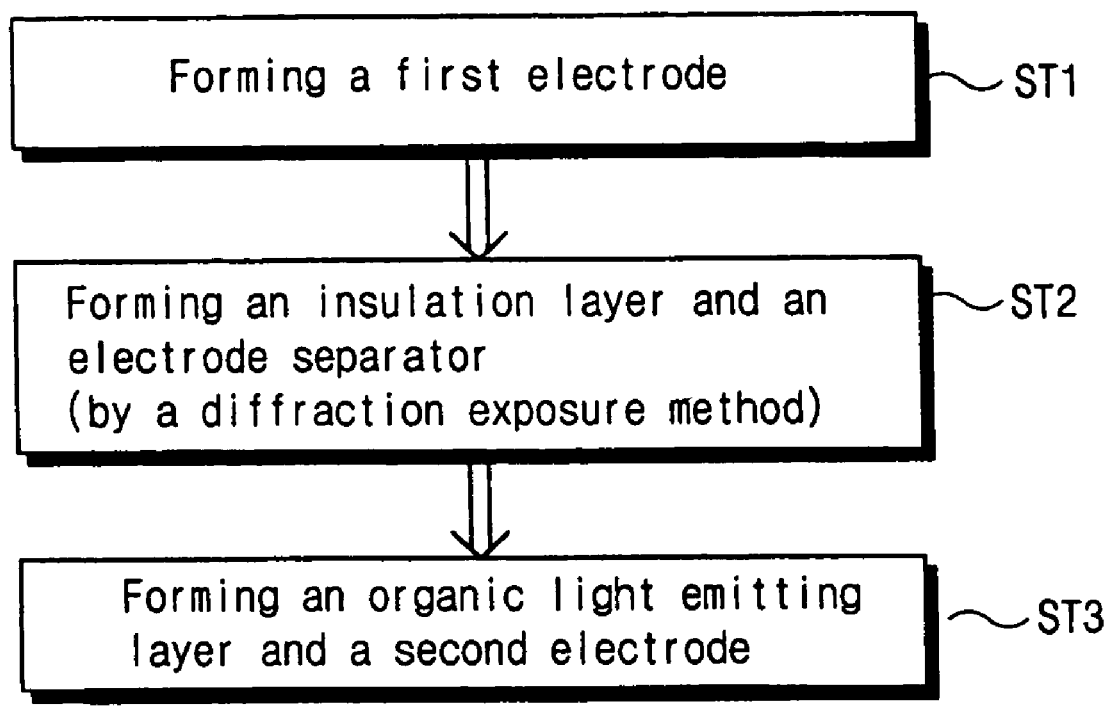
FIG. 8 is a flow chart of an exemplary fabrication sequence for an organic electroluminescent diode of a dual panel-type OELD device according to the present invention.

FIG. 8 is a flow chart of an exemplary fabrication sequence for an organic electroluminescent diode of a dual panel-type OELD device according to the present invention. In FIG. 8, a first step ST1 may include forming a first electrode on a substrate upon which a plurality sub-pixels may be defined. The first electrode may be formed of transparent conductive material, such as indium tin oxide (ITO).

A second step ST2 may include forming an insulating layer and an electrode separator on the first electrode within a boundary region between a first one of the sub-pixels and an adjacent one of the sub-pixels. The insulating layer may improve contact properties between the first electrode and the electrode separator, and may include insulating materials, such as silicon. For example, the insulating layer may be formed of inorganic insulating materials, such as silicon nitride (SiNx) and silicon oxide ($SiO_2$).

The electrode separator may include first, second, and third regions, wherein the electrode separator corresponding to the first region may have an inverse-tapered structure to separately form the organic light-emitting layer and the second electrode within each of the sub-pixels. The electrode separator corresponding to the second region may have an asymmetrically shape structure to cause the connecting electrode to directly contact the second electrode at an electrode separator forming region. The electrode separator corresponding to the third region may have a plurality of depressed portions to prevent an electrical short between the second electrodes within the first and second regions.

The electrode separator may be patterned using photolithographic processes using exposure developing processes of a photoresist material. The electrode separator corresponding to the third region and having a plurality of depressed portions may be formed by using a diffraction exposure method in which only desired portions are selectively exposed to light during the exposure process of the photolithographic processes. More specifically, if a positive-type photoresist material, which has portions that are exposed to light removed after the developing process, is used for forming the electrode separator, the electrode separator corresponding to the third region may be formed by disposing a mask having a slit-pattern corresponding to the depressed portions over the photoresist and then exposing the photoresist material to light. The slit-pattern corresponding to the depressed portions may reduce the light intensity within regions corresponding to the depressed portions of the electrode separator.

The electrode separator corresponding to the second region may have an asymmetrical shape structure with respect to a centerline thereof. That is, a first lateral side of the electrode separator may have an inverse-tapered structure so that the second electrode corresponding to the inverse-tapered side may be severed near the inverse-tapered side of the electrode separator. A second lateral side of the electrode separator may have a slope so that the second electrode corresponding to the sloped side is continuously formed within the sub-pixel and is disposed on the sloped side and on a top surface of the electrode separator. Accordingly, a connecting electrode may be electrically connected to the second electrode by directly contacting the second electrode.

The tapered side structure of the electrode separator may be formed by controlling a width of a light transmission portion and an interval between the light transmission portions formed in the mask used during the photolithographic processes. For example, if a positive-type photoresist material is used for forming the electrode separator, the electrode separator having a sloped lateral side may be formed by gradually narrowing the width of the light transmission portion and the interval between the light transmission portions from a middle portion to a side portion of the electrode separator.

A third step (ST3) may include sequentially forming an organic light-emitting layer material and second electrode material onto the substrate upon which the electrode separator may be formed, thereby forming an organic light-emitting layer and a second electrode within each of the sub-pixels. The organic light-emitting layer and the second electrode may be separately formed within each of the sub-pixels by the electrode separator formed within a boundary region between adjacent ones of the sub-pixels. The organic light-emitting layer and the second electrode corresponding to the second region of the electrode separator may be further formed along the sloped lateral side and on top surface of the electrode separator having the asymmetrical shape structure so that the connecting electrode may directly contact the second electrode. While portions of the organic light-emitting layer material and the second electrode material on top of the electrode separators corresponding to the first and third regions may not function as the organic light-emitting layer and the second electrode, respectively, the organic light-emitting layer material and the second electrode material on the electrode separator corresponding to the second region may function as the organic light-emitting layer and the second electrode. If the first electrode is an anode electrode and the second electrode is a cathode electrode, then the organic light-emitting layer may have a laminated structure including a sequence of a hole injection layer, a hole transporting layer, an emission layer, and an electron transporting layer.

Figure 9:
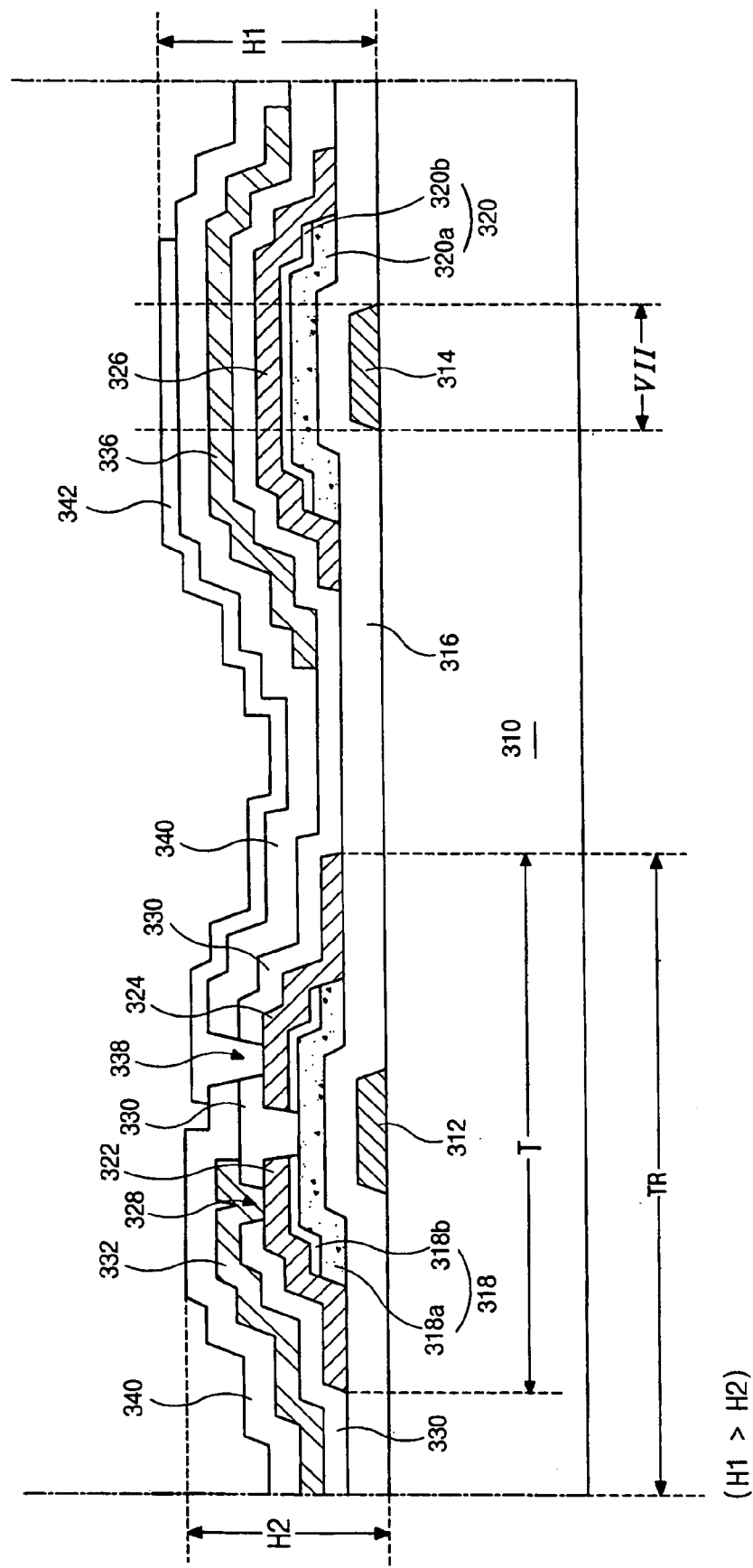
FIG. 9 is a cross sectional view of an exemplary array substrate for a dual panel-type OELD device according to the present invention.

FIG. 9 is a cross sectional view of an exemplary array substrate for a dual panel-type OELD device according to the present invention. In FIG. 9, a gate electrode 312 and a first pattern 314, which may be spaced apart from the gate electrode 312, may be formed on a substrate 310 using a first metal material. A gate insulating layer 316 may be formed along an entire surface of the substrate 310 upon which the gate electrode 312 and the first pattern 314 may be formed. A first semiconductor pattern 318 may cover the gate electrode 312 and a second semiconductor pattern 320 may cover the first pattern 314 using first and second semiconductor materials. For example, the first semiconductor pattern 318 may include a laminated structure of an active layer 318a and an ohmic contact layer 318b, and the second semiconductor pattern 320 may include a laminated structure of first and second layers 320a and 320b. The active layer 318a and the first layer 320a may include amorphous silicon, and the ohmic contact layer 318b and the second layer 320b may include impurity-doped amorphous silicon. Source and drain electrodes 322 and 324 may be spaced apart from each other, and may be formed on the ohmic contact layer 318b. In addition, a third pattern 326 is formed on the second semiconductor pattern 320, wherein the source and drain electrodes 322 and 324 and the third pattern 326 may be formed of the same conductive materials. Accordingly, the gate electrode 312, the first semiconductor pattern 318, and the source and drain electrodes 322 and 324 form a thin film transistor T.

In FIG. 9, an interlayer 330 having a first contact hole 328 for exposing a portion of the source electrode 322 may formed along an entire surface of the substrate 310 upon which the source and drain electrodes 322 and 324 and the third pattern 326 may be formed. A power supply line 332 contacting a portion of the source electrode 322 via the first contact hole 328 may be formed on the interlayer 330, and a fourth pattern 336 may be formed on the interlayer 330 within a space corresponding to the third pattern 326 using the same materials as the power supply line 332. A passivation layer 340 having a drain contact hole 338 for exposing a portion of the drain electrode 324 may be formed along an entire surface of the substrate 310 upon which the power supply line 332 and the fourth pattern 336 may be formed. A connecting electrode 342 that contacts a portion of the drain electrode 324 via the drain contact hole 338 may be formed on the passivation layer 340. Although not shown, the power supply line 332 may serve to provide a signal for power supplying to the thin film transistor T.

In FIG. 9, a connecting electrode 342 may be further formed to cover the fourth pattern 336. An area on the substrate 310 where the first, second, third, and fourth patterns 314, 320, 326, and 336 and the connecting electrode 342 overlap may form a projected region VII. A first height H1 of the projected region VII may be larger than a second height H2 of a thin film transistor region TR.

Accordingly, a second electrode 160 (in FIG. 5) that may be formed beneath the electrode separator 156 (in FIG. 5) may directly contact the connecting electrode 342. In addition, the second electrode 160 (in FIG. 5) may be connected to the connecting electrode 342 within space corresponding to the projected region VII. Thus, if the first height H1 of the projected region VII having a laminated structure of first, second, third, and fourth patterns 314, 320, 326, and 336 and the connecting electrode 342 is lower than the second height H2 of the thin film transistor region TR, then the electrode separator 156 (in FIG. 5) having a certain height may fail to contact the connecting electrode 342 due to a distance between the connecting electrode 342 and an upper substrate (not shown). In addition, there is a limit in forming the electrode separator 156 (in FIG. 5) to have a certain height. If the electrode separator 156 (in FIG. 5) fails to properly contact the connecting electrode 342, it may cause poor electrical connection properties between a sub-pixel and an adjacent sub-pixel, thereby causing a defective array element.

To overcome aforementioned problems, the first height H1 of the laminated structure corresponding to the projected region VII may be formed higher than the second height H2 of the laminated structure corresponding to the thin film transistor region TR. The first, second, third, and fourth patterns 314, 320, 326 and 336 may not be electrically connected to any component of the array elements and may be simultaneously formed with the gate electrode 312, the semiconductor layer 318, the source and drain electrodes 322 and 324, and the power supply line without any additional fabrication processes.

In FIG. 5, the thin film transistor T may be a driving thin film transistor connected to the organic electroluminescent diode E. Although the thin film transistor T having the inverted staggered-type gate structure is shown in FIG. 5, the present invention may be applied to other OELD devices having different types of thin film transistors, for example, a thin film transistor having a top gate structure.

Figure 10:
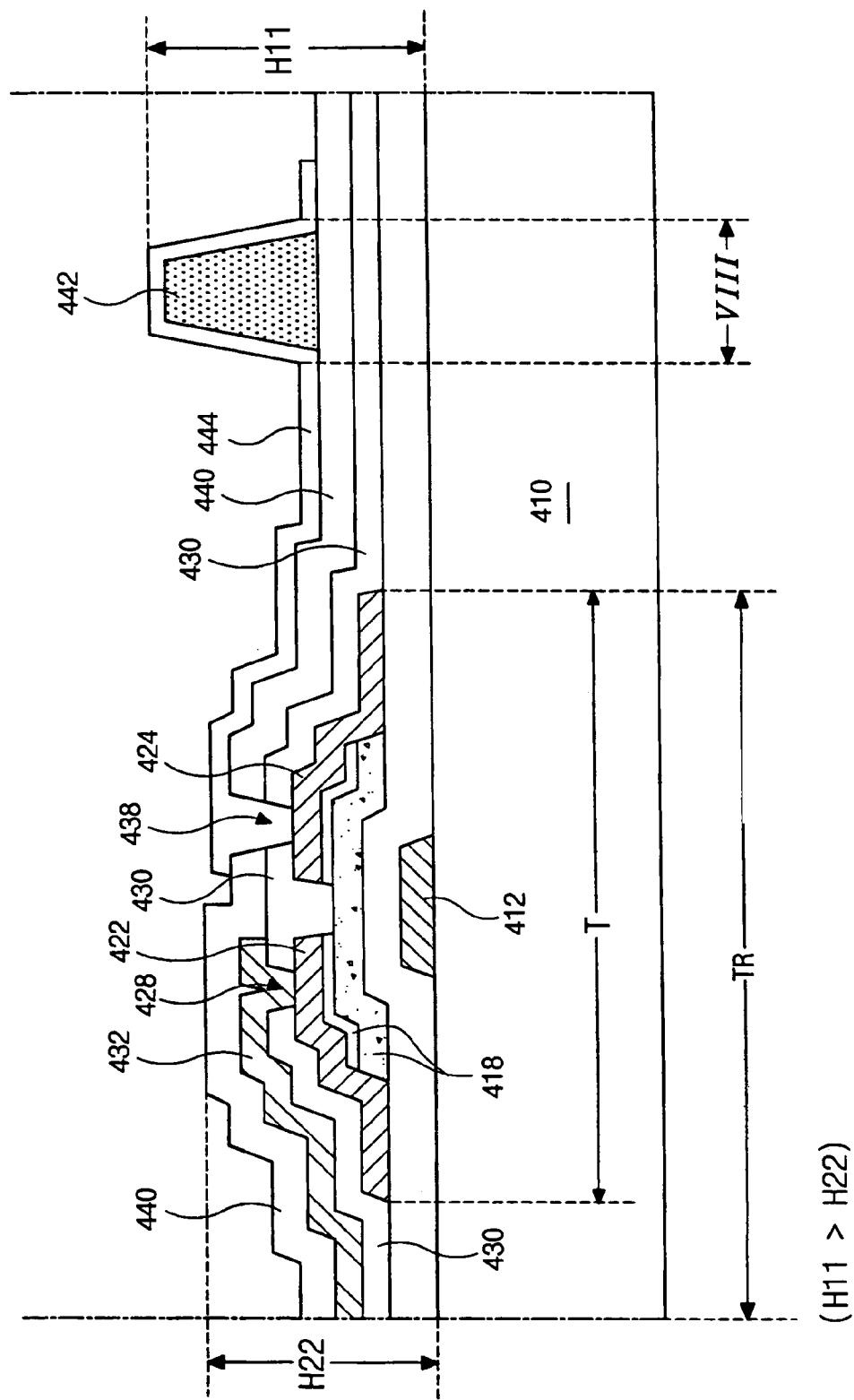
FIG. 10 is a cross sectional view of another exemplary array substrate for a dual panel-type OELD device according to the present invention.

FIG. 10 is a cross sectional view of another exemplary array substrate for a dual panel-type OELD device according to the present invention. In FIG. 10, an OELD device may include a thin film transistor region TR, which may having a thin film transistor T, and a projected region VIII, which may have an additional projected pattern 442 formed to increase a height of a laminated structure corresponding to the projected region VIII. While many laminated layers such as the first, second, third, and fourth patterns 314, 320, 326, and 336 (in FIG. 9) may be formed within the projected region VII (in FIG. 9) to raise the first height H1 of the laminated structure corresponding to the projected region VII, the additional projected pattern 442 may be formed to raise a first height H11 of a laminated structure corresponding to the projected region VIII.

In FIG. 10, the thin film transistor T may include a gate electrode 412, a semiconductor layer 418, and source and drain electrodes 422 and 424 formed on a substrate 410. An interlayer 430 having a first contact hole 428 for exposing a portion of the source electrode 422 may be formed along an entire surface of the substrate 410 upon which the source and drain electrodes 422 and 424 may be formed. A power supply line 432 connected to the source electrode 422 via the first contact hole 428 may be formed on the interlayer 430. A passivation layer 440 having a drain contact hole 438 for exposing a portion of the drain electrode 424 may be formed along an entire surface of the substrate 410 upon which the power supply line 432 may be formed. The projected pattern 442 spaced apart from the thin film transistor T may be formed on the passivation layer 440 within space corresponding to the projected region VIII. A connecting electrode 444 connected to the drain electrode 424 via the drain contact hole 438 may be formed on the projected pattern 442 and a portion of the passivation layer 440.

The projected pattern 442 corresponding to the projected region VIII and a first height H11 of a laminated structure corresponding to the projected region VIII may be higher than a second height H22 of a laminated structure corresponding to the thin film transistor region TR. The projected pattern 442 may be formed of insulating material, such as an organic insulating material, in order to form the projected pattern 442 to have a relatively large thickness.

Figure 11:
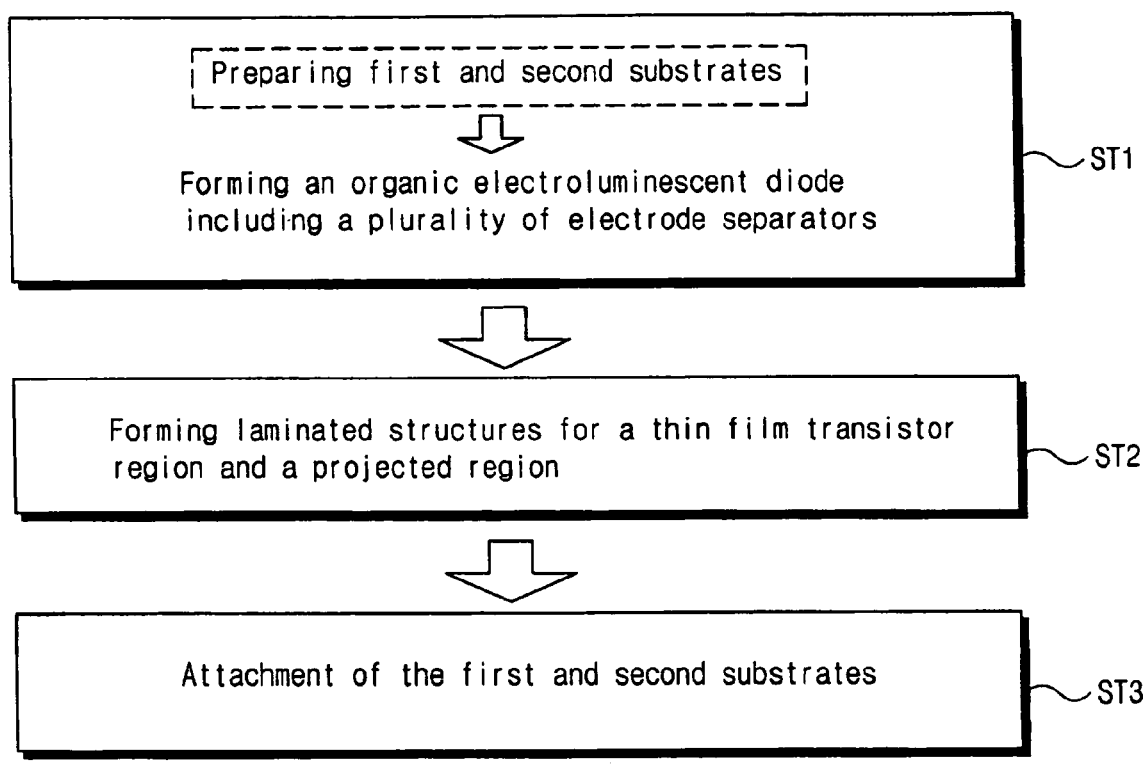
FIG. 11 is a flow chart of another exemplary fabrication sequence for a dual panel-type OELD device according to the present invention.

FIG. 11 is a flow chart of another exemplary fabrication sequence for a dual panel-type OELD device according to the present invention. A first step ST1 may include forming an organic electroluminescent diode having a plurality of electrode separators having first, second, and third regions on a second substrate. For example, the first step ST1 may comprise steps of defining a plurality of sub-pixels on first and second substrates, forming a first electrode on the second substrate, forming an insulating layer and an electrode separator on the first electrode in a boundary of sub-pixel, and forming an organic light-emitting layer and a second electrode in each pixel.

The electrode separator may include first, second, and third regions. The first region of the electrode separator may have a trapezoidal shape whose opposing lateral sides have inverse-tapered surfaces. The second region of the electrode separator may have an asymmetrical shape whose first lateral side is inversely tapered and a second lateral side is inclined. The third region disposed between the first and second regions may have a plurality of depressed portions. The electrode separator having the first, second, and third regions may be patterned by a diffraction exposure method in which light intensity is selectively controlled by a mask according to a width of a light transmission portion and an interval between the light transmission portions.

A second step ST2 includes forming a thin film transistor within a thin film transistor region and forming a laminated structure having a height higher than that of the thin film transistor region within a projected region. For example, a gate electrode, a semiconductor layer, a source electrode, a drain electrode, and a power supply line may be formed during the forming of the thin film transistor within the thin film transistor region. The laminated structure of the projected region may have a height larger than the laminated structure of the thin film transistor region and may provide an area for contacting the second region of the electrode separator and a connecting electrode. The height of the laminated structure of the projected region may be increased by forming first, second, third, and fourth patterns within the projected region simultaneously with formation of the gate electrode, the semiconductor layer, the source electrode, the drain electrode, and the power supply line, respectively. Alternatively, the height of the laminated structure of the projected region may be increased by forming an additional projected pattern after forming a passivation layer over the thin film transistor. The projected pattern may be formed of organic insulating material.

A third step (ST3) may include attaching the first and second substrates together. Accordingly, an array element layer on the first substrate may be electrically connected to an organic electroluminescent diode on the second substrate by contacting a portion of the second electrode formed within the second region of the electrode separator with the connecting electrode formed over the projected region.

According to the present invention, the OELD device has the following advantages. First, since the array element layer and the organic electroluminescent diode may be formed on a different substrate, production yield, production management efficiency, and life cycle of the device may be improved. Second, since the dual panel-type OELD device may function as a top emission-type OELD device, design of the thin film transistor may be simplified and high aperture ratio and high resolution may be achieved. Third, since the connecting electrode may directly contact the second electrode formed on the electrode separator, additional connecting patterns for connecting the connecting electrode to the second electrode may not be necessary. Fourth, since the connecting electrode may be connected to the second electrode at the electrode separator forming region within the non-light emitting region, damage to the light-emitting region may be avoided. Fifth, since laminated structures within the projected region having first, second, third, and fourth patterns may be formed simultaneously with the gate electrode, the semiconductor layer, the source and drain electrodes, and the power supply line, respectively, a height of the laminated structure within the thin film transistor region may be increased. Thus, electrical connection properties between the connecting electrode and the second electrode and between the array elements within a sub-pixel and the array element in an adjacent sub-pixel may be improved, thereby increasing production yield. Sixth, since the height of the projected region may be increased by forming a projected pattern on the passivation layer within a space corresponding to the projected region instead of forming laminated patterns within the projected region, contact properties between the connecting electrode and the second electrode and between the array elements in a sub-pixel and the array element in an adjacent sub-pixel may be improved, thereby increasing production yield.

It will be apparent to those skilled in the art that various modifications and variations can be made in the dual panel-type organic electroluminescent display device and the method of fabricating dual panel-type organic electroluminescent display device of the present invention without departing from the spirit or scope of the invention. Thus, it is intended that the present invention cover the modifications and variations of this invention provided they come within the scope of the appended claims and their equivalents.

What is claimed is:

1. An organic electroluminescent display (ELD) device, comprising:
    first and second substrates having a plurality of sub-pixels defined thereon;
    an array element layer on the first substrate having a plurality of thin film transistors corresponding to each of the sub-pixels;
    a connecting electrode on the array element layer connected to one of the thin film transistors;
    a first electrode on an inner surface of the second substrate;
    an insulating layer and an electrode separator formed within a boundary region of each of the sub-pixels, the insulating layer formed beneath the first electrode and the electrode separator formed beneath the insulating layer; and
    an organic light-emitting layer and a second electrode formed in each of the sub-pixels,
    wherein the electrode separator includes a first region having a pattern structure for separately forming the organic light-emitting layer and the second electrode within each of the sub-pixels, a second region having a pattern structure for directly contacting the connecting electrode with the second electrode under the electrode separator, and a third region having a pattern structure for preventing an electrical short between a second electrode portion in the first region and a second electrode portion in the second region, and
    wherein the second electrode formed within a space corresponding to the second region contacts the connecting electrode.

2. The device according to claim 1, wherein the electrode separator of the first region has a trapezoidal shape having a width gradually increasing from a bottom surface and to a top surface, the electrode separator of the second region has an asymmetrical shape having an inverse-tapered first lateral side and a second lateral side inclined toward the first lateral side, and the electrode separator of the third region has a plurality of depressed portions.

3. The device according to claim 2, wherein the electrode separators of the second and third regions are formed by a diffraction exposure method.

4. The device according to claim 1, wherein the first and second electrodes and the organic light-emitting layer form an organic electroluminescent diode, and the thin film transistor has a gate electrode, a semiconductor layer, and source and drain electrodes, wherein the thin film transistor is a driving thin film transistor for supplying a current to the organic electroluminescent diode and the connecting electrode is electrically connected to the drain electrode.

5. The device according to claim 4, further comprising a projected region having a laminated structure on the first substrate, wherein a height of the laminated structure is larger than a height of the array element layer, and the connecting electrode contacts the second electrode over the projected region.

6. The device according to claim 5, wherein first, second, and third patterns have island shaped patterns and are simultaneously formed within the projected region during formation of the gate electrode, the semiconductor layer, and the source and drain electrodes, respectively, using the same materials as the gate electrode, the semiconductor layer, and the source and drain electrodes.

7. The device according to claim 6, further comprising a power supply line connected to the source electrode, and a fourth pattern over the third pattern, wherein the fourth pattern and the power supply line are simultaneously formed using the same materials.

8. The device according to claim 1, further comprising a passivation layer having a drain contact hole exposing a portion of the drain electrode, a projected pattern on the passivation layer within the projected region, and a connecting electrode on the projected pattern, wherein the connecting electrode contacts the drain electrode via the drain contact hole.

9. The device according to claim 8, wherein the projected pattern is formed of insulating material.

10. The device according to claim 9, wherein the insulating material includes organic insulating material.

11. A method of fabricating an organic electroluminescent display (ELD) device having a first substrate including an array element layer comprising a thin film transistor, a second substrate having an organic electroluminescent diode, and a connecting electrode between the first and second substrates, the method comprising:
    forming a first electrode on the second substrate having a plurality of sub-pixels;
    forming an insulating layer and an electrode separator within a boundary of each of the sub-pixels; and
    forming an organic light-emitting layer and a second electrode within each of the sub-pixels separated by the electrode separator,
    wherein the electrode separator includes a first region having a trapezoidal shape with a width gradually increasing from a bottom surface and to a top surface, a second region having an asymmetrical shape with a first inverse-tapered lateral side and a second lateral side inclined toward the first lateral side, and a third region having a plurality of depressed portions spaced apart from each other and disposed between the first and second regions, and
    wherein the second electrode is formed within a space corresponding to the second region and contacts the connecting electrode.

12. The method according claim 11, further comprising attaching the first and second substrates together after forming the organic light-emitting layer and the second electrode, wherein the first and second substrates are electrically interconnected by contacting the connecting electrode with the second electrode.

13. The method according claim 11, wherein the electrode separator is formed by a diffraction exposure method.

14. The method according claim 13, wherein the electrode separator of the second region is formed by controlling widths of light transmission portions and intervals between the light transmission portions of a mask for the diffraction exposure method.

15. The method according claim 13, wherein the electrode separator of the third region is formed by the diffraction exposure method using a mask having a slit pattern corresponding to the depressed portion.

16. The method according claim 11, wherein the thin film transistor includes a gate electrode, a semiconductor layer, a source electrode, a drain electrode, and a power supply line.

17. The method according claim 16, wherein the array element layer further comprises a projected region having a laminated structure having a height larger than a height of the thin film transistor, and the connecting electrode contacts the second electrode over the projected region.

18. The method according claim 17, further comprising attaching the first and second substrates together after forming the organic light-emitting layer and the second electrode, wherein the first and second substrates are electrically interconnected by contacting the connecting electrode with the second electrode over the projected region.

19. The method according claim 17, wherein the laminated structure of the projected region has first, second, third, and fourth patterns overlapping each other that are formed simultaneously with the gate electrode, the semiconductor layer, the source and drain electrodes, and the power supply line using the same materials as the gate electrode, the semiconductor layer, the source and drain electrodes, and the power supply line, respectively.

20. The method according claim 17, further comprising forming a passivation layer having a drain contact hole for exposing a portion of the drain electrode on the thin film transistor, and forming a projected pattern on the passivation layer within a space corresponding to the projected region.

21. The method according claim 20, wherein the projected pattern includes organic insulating material.

22. A method for fabricating an organic electroluminescent display (ELD) device, comprising:
    forming an array element layer having a plurality of thin film transistors on a first substrate upon which a first plurality of sub-pixels is defined;
    forming a connecting electrode connected to the thin film transistor on the array element layer;
    forming a first electrode on a second substrate upon which a second plurality of sub-pixels is defined that correspond to the first plurality of sub-pixels;
    forming an insulating layer and an electrode separator within a boundary of each of the first and second plurality of sub-pixels;
    forming an organic light-emitting layer and a second electrode within each of the first and second plurality of sub-pixels separated by the electrode separator; and
    attaching the first and second substrates together,
    wherein the electrode separator has a first region having a trapezoidal shape with a width gradually increasing from a bottom surface and to a top surface, a second region having an asymmetrical shape with a first inverse-tapered lateral side and a second lateral side inclined toward the first lateral side, and a third region having a plurality of depressed portions spaced apart from each other and disposed between the first and second regions, and
    wherein the second electrode is formed within a space corresponding to the second region and contacts the connecting electrode.

23. The method according claim 22, wherein the electrode separator is formed by a diffraction exposure method.

24. The method according claim 23, wherein the electrode separator of the second region is formed by controlling widths of light transmission portions and intervals between the light transmission portions of a mask for the diffraction exposure method.

25. The method according claim 23, wherein the electrode separator of the third region is formed by the diffraction exposure method using a mask having a slit pattern corresponding to the depressed portion.

26. The method according claim 22, wherein the thin film transistor includes a gate electrode, a semiconductor layer, a source electrode, a drain electrode, and a power supply line.

27. The method according claim 26, wherein the array element layer further comprises a projected region having a laminated structure having a height larger than a height of the thin film transistor, and the connecting electrode contacts the second electrode over the projected region.

28. The method according claim 27, wherein the laminated structure of the projected region includes first, second, third, and fourth patterns overlapping each other that are formed simultaneously with the gate electrode, the semiconductor layer, the source and drain electrodes, and the power supply line using the same materials as the gate electrode, the semiconductor layer, the source and drain electrodes, and the power supply line, respectively.

29. The method according claim 27, further comprising forming a passivation layer having a drain contact hole exposing a portion of the drain electrode on the thin film transistor, and forming a projected pattern on the passivation layer within a space corresponding to the projected region.

30. The method according claim 29, wherein the projected pattern includes organic insulating material.

* * * * *